United States Patent
Hirayama et al.

(10) Patent No.: US 10,455,750 B2
(45) Date of Patent: Oct. 22, 2019

(54) INSPECTION SUPPORT DEVICE AND INSPECTION SUPPORT METHOD

(71) Applicant: FUJI CORPORATION, Chiryu-shi (JP)

(72) Inventors: Hirotaka Hirayama, Toyohashi (JP); Shigeto Oyama, Kariya (JP); Satoshi Yoshioka, Nagoya (JP); Satoshi Ushii, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 90 days.

(21) Appl. No.: 15/544,757

(22) PCT Filed: Jan. 20, 2015

(86) PCT No.: PCT/JP2015/051318
§ 371 (c)(1),
(2) Date: Jul. 19, 2017

(87) PCT Pub. No.: WO2016/117017
PCT Pub. Date: Jul. 28, 2016

(65) Prior Publication Data
US 2018/0014439 A1  Jan. 11, 2018

(51) Int. Cl.
H05K 13/04  (2006.01)
H05K 13/02  (2006.01)
H05K 13/08  (2006.01)

(52) U.S. Cl.
CPC ....... H05K 13/0452 (2013.01); H05K 13/021 (2013.01); H05K 13/0408 (2013.01);
(Continued)

(58) Field of Classification Search
None
See application file for complete search history.

(56) References Cited

U.S. PATENT DOCUMENTS 6,260,178 B1 *  7/2001  Schaffer ............... H05K 13/085
                                                       716/119
6,289,582 B1 *  9/2001  Maenishi ............. H05K 13/085
                                                       29/832
(Continued)

FOREIGN PATENT DOCUMENTS

JP  2002-299900 A  10/2002
JP  2005-150387 A   6/2005
(Continued)

OTHER PUBLICATIONS

International Search Report dated Apr. 28, 2015 in PCT/JP2015/051318 filed Jan. 20, 2015.
(Continued)

*Primary Examiner* — Jason Lin
(74) *Attorney, Agent, or Firm* — Oblon, McClelland, Maier & Neustadt, L.L.P.

(57) ABSTRACT

The inspection support device is provided with a camera provided on a moving body so as to be capable of imaging a circuit board, and an imaging control section configured to control imaging processing of the camera and acquire image data of an inspection component, which is a component that is a target for inspection among electronic components mounted by the component mounter, when the inspection component is mounted on the circuit board. The imaging control section optimizes the performance sequence of multiple of the mounting operations and multiple of the imaging operations based on a moving distance of the moving body during the performance sequence or based on a time required for the mounting operation and the imaging operation during the performance sequence.

9 Claims, 5 Drawing Sheets

(52) U.S. Cl.
CPC ......... *H05K 13/08* (2013.01); *H05K 13/0815* (2018.08); *H05K 13/0853* (2018.08); *H05K 13/0473* (2013.01)

(56) References Cited

U.S. PATENT DOCUMENTS

| | | | | |
|---|---|---|---|---|
| 6,356,352 | B1* | 3/2002 | Sunni | H05K 13/04 29/700 |
| 8,086,338 | B2* | 12/2011 | Yano | G05B 19/41805 700/108 |
| 8,612,041 | B2* | 12/2013 | Shim | H05K 13/041 700/100 |
| 2005/0065620 | A1 | 3/2005 | Maenishi et al. | |
| 2005/0288806 | A1* | 12/2005 | Yamazaki | H05K 13/0413 700/95 |
| 2006/0117560 | A1* | 6/2006 | Yamasaki | H05K 13/0413 29/832 |
| 2016/0216215 | A1* | 7/2016 | Hong | G01N 21/95684 |

FOREIGN PATENT DOCUMENTS

| | | |
|---|---|---|
| JP | 2005-353776 A | 12/2005 |
| JP | 2007-221176 A | 8/2007 |
| JP | 2008-258283 A | 10/2008 |
| JP | 2009-4754 A | 1/2009 |
| JP | 2009-147018 A | 7/2009 |
| JP | 2013-26278 A | 2/2013 |
| WO | WO 2015/001634 A1 | 1/2015 |

OTHER PUBLICATIONS

Office Action dated Oct. 9, 2018 in Japanese Patent Application No. 2016-570234, citing document AO therein, 4 pages (submitting unedited computer generated English translation only).
Extended European Search Report dated Dec. 1, 2017 in Patent Application No. 15878713.5.

* cited by examiner

INSPECTION SUPPORT DEVICE AND INSPECTION SUPPORT METHOD

TECHNICAL FIELD

The present application relates to an inspection support device applied to a component mounter that mounts electronic components on a circuit board.

BACKGROUND ART

As disclosed in patent literature 1, a component mounter picks up an electronic component at a supply position using a suction nozzle and mounts the electronic component at specified coordinates (mounting position) on a circuit board. For a circuit board on which multiple electronic components have been mounted by a component mounter, the mounting state of the electronic components is automatically inspected by a visual inspection device positioned downstream to the component mounter in a production line (refer to patent literature 2). The mounting state of electronic components includes things such as the deviation amount of an electronic component with respect to the mounting position, the orientation of an electronic component, and the presence of damage.

Also, inspection of circuit boards, in addition to automatic inspection by a visual inspection device of a target circuit board for which mounting is complete, includes manual visual inspection by an operator of a target circuit board for which mounting is still being performed. Visual inspection, for example, is required when mounting electronic components that require particularly mounting accuracy, or components that are easily damaged. During visual inspection, an operator visually checks electronic components that are targets for inspection mounted on the circuit board and determines whether the mounting state is good or bad.

CITATION LIST

Patent Literature

Patent Literature 1: JP-A-2013-026278
Patent Literature 2: JP-A-2002-299900

SUMMARY

However, for manual visual inspection at a component mounter, there are cases in which it is not easy to determine whether a mounting state is good or bad due to factors such as the tiny scale of electronic components. In such cases, manual visual inspection takes a long time, meaning that inspection time may adversely affect production efficiency of the component mounter.

The present disclosure takes account of such circumstances, and an object thereof is to provide an inspection support device that enables inspection of a mounting state of an electronic component at a component mounter with improved efficiency.

The inspection support device of the present disclosure is applied to a component mounter provided with a transfer device that picks up an electronic component supplied to a supply position and transfers the electronic component to a mounting position on a circuit board. The inspection support device supports inspection of a mounting state performed on the electronic component mounted on the circuit board as the target. The transfer device includes a moving body supported to be relatively movable with respect to a base, and a mounting head provided on the moving body, the mounting head supporting multiple suction nozzles that hold the electronic component. The inspection support device is provided with a camera capable of imaging the circuit board, the camera being provided on the moving body, and an imaging control section configured to control imaging processing of the camera and acquire image data of an inspection component, which is a component that is a target for inspection among the electronic components mounted by the component mounter, when the inspection component is mounted on the circuit board. Mounting operation is defined as the operation performed in order based on a control program, which is an operation of the transfer device to mount the inspection component held by the suction nozzle at the mounting position by moving the suction nozzle from its current position to a position above the mounting position and lowering the suction nozzle. Imaging operation is defined as operation of the transfer device to move the camera from its current position to a position above the mounting position such that the camera is capable of imaging of the inspection component mounted at the mounting position. The imaging control section optimizes a performance sequence of multiple of the mounting operations and multiple of the imaging operations based on a moving distance of the moving body during the performance sequence or based on a time required for the mounting operation and the imaging operation during the performance sequence.

The inspection support method of the present disclosure is applied to a component mounter provided with a transfer device that picks up an electronic component supplied to a supply position and transfers the electronic component to a mounting position on a circuit board. The inspection support method supports inspection of a mounting state performed on the electronic component mounted on the circuit board as the target. The transfer device includes a moving body supported to be relatively movable with respect to a base, and a mounting head provided on the moving body, the mounting head supporting multiple suction nozzles that hold the electronic component. Mounting operation is defined as the operation performed in order based on a control program, which is an operation of the transfer device to mount the inspection component held by the suction nozzle at the mounting position by moving the suction nozzle from its current position to a position above the mounting position and lowering the suction nozzle. Imaging operation is defined as operation of the transfer device to move the camera, which is provided on the moving body to be capable of imaging the circuit board, from its current position to a position above the mounting position such that the camera is capable of imaging of the inspection component mounted at the mounting position is defined as imaging operation. The inspection support method optimizes the performance sequence of multiple of the mounting operations and multiple of the imaging operations based on a moving distance of the moving body during the performance sequence or based on a time required for the mounting operation and the imaging operation during the performance sequence, and controls imaging processing of the camera to acquire image data of the inspection component, which is a component that is a target for inspection among the electronic components mounted by the component mounter, when the inspection component is mounted on the circuit board.

Advantageous Effects

According to the configuration of the present disclosure, the inspection support device enables inspection of a mounting state based on image data acquired by imaging of a camera provided in a component mounter. Also, with respect to mounting operations performed in a predetermined order based on a control program, the timing for performing imaging operation is optimized based on a moving distance of a moving body or a required time (time required for mounting operation and imaging operation). By this, because required image data is acquired efficiently, efficiency of inspection of the mounting state is improved.

DESCRIPTION OF EMBODIMENTS

Hereinafter, an embodiment of an inspection support device and an inspection support method of the present disclosure are described with reference to the figures. The inspection support device and the inspection support method are applied to a component mounter, and support inspection at the component mounter. A component mounter picks up an electronic component at a supply position using a suction nozzle and mounts the electronic component at specified coordinates (mounting position) on a circuit board.

Embodiments

1. Overall Configuration of Component Mounter 1

Figure 1:
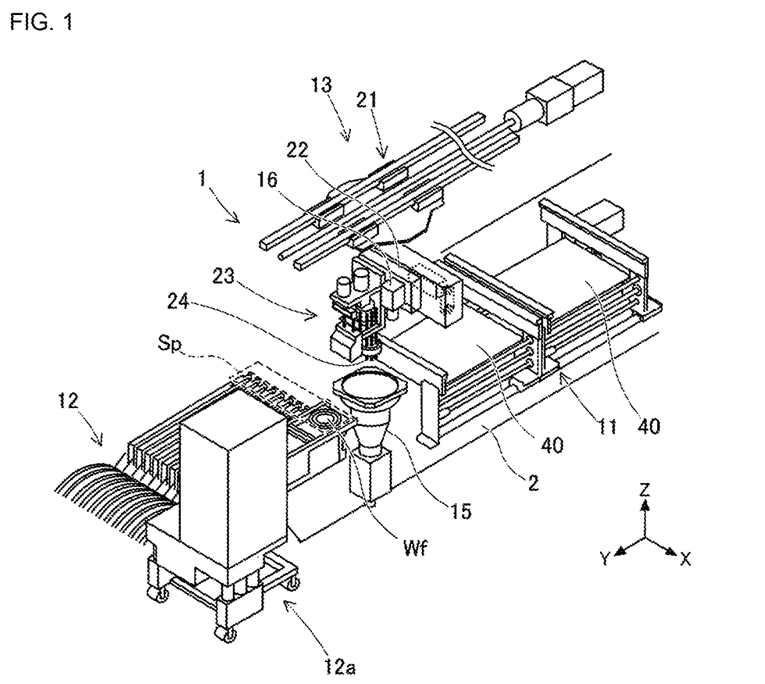
FIG. 1 is an overall view of a component mounter of an embodiment.

The configuration of component mounter 1 will be described with reference to FIG. 1. As shown in FIG. 1, component mounter 1 is provided with board conveyance device 11, component supply device 12, component transfer device 13, component camera 15, board camera 16, and control device 30. In the descriptions below, the horizontal width direction of component mounter 1 (direction from the upper left to the lower right in FIG. 1) is the X-axis direction, the horizontal lengthwise direction of component mounter 1 (direction from the upper right to the lower left in FIG. 1) is the Y-axis direction, and the direction perpendicular to the X axis and Y axis (up-down direction of FIG. 1) is the Z-axis direction.

Board conveyance device 11 is configured from a belt conveyor or the like and consecutively conveys circuit boards 40 in a conveyance direction. Board conveyance device 11 positions circuit board 40 at a specified position inside component mounter 1. Then, after mounting processing has been performed by component mounter 1, board conveyance device 11 unloads circuit board 40 from component mounter 1.

Component supply device 12 supplies electronic components to be mounted on circuit board 40 to supply position Sp. In the present embodiment, the above electronic components include electronic components stored at a regular pitch in carrier tape, and chips cut into individual components from wafer Wf. Carrier tape is fed by feeders removably set in multiple slots of component supply device 12. By this, component supply device 12 supplies electronic components at a pickup section at the tip of the feeder.

Also, component supply device 12 is provided with wafer supply device 12a that supplies chips of wafers Wf. For example, many chips are formed in a grid on a wafer body, and are cut into individual components by being cut by a laser cutter after being affixed to an adhesive sheet. Electronic components stored in carrier tape and chips of wafers Wf correspond to the "electronic components" of the present disclosure.

Component transfer device 13 is configured to move in the X-axis direction and the Y-axis direction. Component transfer device 13 is arranged from the rear side in the lengthwise direction of component mounter 1 (the upper right side in FIG. 1) to above component supply device 12 at the front of component mounter 1. Component transfer device 13 is provided with head driving device 21, moving body 22, and mounting head 23. Head driving device 21 is configured to move moving body 22 in the XY-axis directions using a linear motion mechanism.

Mounting head 23 is removably provided on moving body 22 of head driving device 21. Also, mounting head 23 supports multiple nozzles 24 removably provided on multiple nozzle holders. Mounting head 23 supports each suction nozzle so as to be rotatable around an R axis parallel to the Z axis and able to be raised/lowered.

Each suction nozzle 24 has supply conditions such as raising/lowering position (Z-axis direction position) and angle with respect to mounting head 23, and supply of negative pressure, controlled. By supplying negative pressure to suction nozzle 24, the electronic component supplied to the feeder pickup section, or the chip of a wafer Wf supplied by wafer supply device 12, is picked up and held.

Component camera 15 and board camera 16 are digital cameras with an imaging element such as a charge coupled device (CCD) or a complementary metal oxide semiconductor (CMOS). Component camera 15 and board camera 16 each perform imaging of a visual field range based on a control signal from control device 30 that is communicatively connected to component camera 15 and board camera 16, and transmit image data acquired from the imaging operation to control device 30.

Component camera 15 is fixed to base 2 of component mounter 1 such that a light axis is aligned in the vertical direction (Z-axis direction), and is configured to be able to image from beneath component transfer device 13. More specifically, component camera 15 is configured to be able to image the bottom surface of an electronic component being held by suction nozzle 24. In detail, the lens unit of component camera 15, is set such that a target object at a specified distance from the imaging element is in focus. Also, the camera field of view of the lens unit of component camera 15 is set to a size such that all of the suction nozzles 24 supported on mounting head 23 can fit in the view.

Board camera 16 (which corresponds to the "camera" of the present disclosure) is provided on moving body 22 of component transfer device 13 such that a light axis is in the vertical direction (Z-axis direction). Board camera 16 is configured to be able to image circuit board 40. Control device 30 that has acquired image data from board camera 16, for example, by recognizing positioning marks provided on the board by image processing, recognizes the positioning state of circuit board 40 by board conveyance device 11. Then, control device 30 corrects the position of moving body 22 according to the positioning state of circuit board 40, and controls mounting processing such that mounting of the electronic components is performed.

Also, in the present embodiment, board camera 16 performs imaging processing for acquiring image data used in inspection at component mounter 1. In this inspection, inspection components 50 are set as targets for inspection among the electronic components mounted on circuit board 40 and the mounting state of these electronic components is determined to be good or bad. That is, board camera 16, in addition to acquiring image data used in mounting processing, also acquires image data used in inspection. This board camera 16 configures inspection support device 90 that supports inspection of a mounting state. Note that, the above inspection includes automatic inspection and manual visual inspection by an operator.

Figure 2:
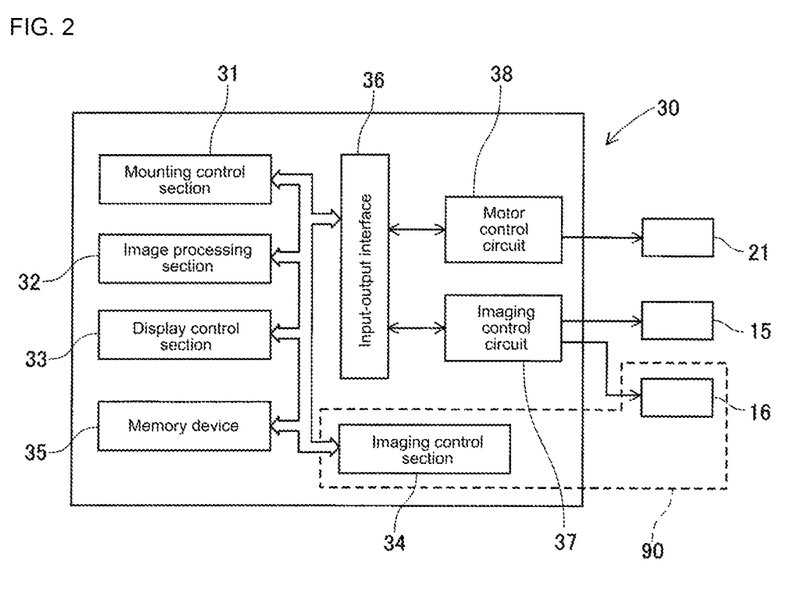
FIG. 2 is a block diagram showing a control device of the component mounter applied as an inspection support device.

Control device 30 is configured mainly from a CPU, various types of memory, and control circuits, and control device 30 controls mounting processing of mounting electronic components on circuit board 40 based on image data acquired from imaging by component camera 15 and board camera 16. As shown in FIG. 2, control device 30 is configured such that input-output interface 36 is connected to mounting control section 31, image processing section 32, imaging control section 33, display control section 34, and memory device 35 via a bus. Motor control circuit 37 and imaging control circuit 38 are connected to input-output interface 36.

Mounting control section 31 controls the position of mounting head 23 and operation of the pickup mechanism via motor control circuit 37. Specifically, mounting control section 31 receives information outputted from various sensors provided on component mounter 1, and results of various recognition processing. Then, mounting control section 31 sends control signals to motor control circuit 37 based on a control program memorized in memory device 35, information from the various sensors, and the results of image processing and recognition processing. By this, the position and rotation angle of suction nozzle 24 supported on mounting head 23 are controlled.

Image processing section 32 acquires image data by imaging of component camera 15 and board camera 16 via imaging control circuit 38, and performs image processing based on usage. Included in image processing are, for example, binarization of image data, filtering, hue extraction, and high resolution processing.

Imaging control section 33 sends control signals to each device such that specified imaging targets are imaged by component camera 15 and board camera 16. Specifically, imaging control section 33, in a case of acquiring image data that includes a positioning mark provided on circuit board 40, sends control signals to component mounter 1 to move board camera 16 provided on moving body 22 so as to be above the positioning mark. Then, imaging control section 33 sends control signals to board camera 16 moved above the positioning mark to perform imaging processing.

In the present embodiment, imaging control section 33 controls imaging processing for acquiring image data used in inspection at component mounter 1. Further, imaging control section 33 optimizes the timing of performing imaging processing of board camera 16 that is also used to acquire image data used in inspection. Details of the above optimizing by imaging control section 33 are described later.

Figure 4:
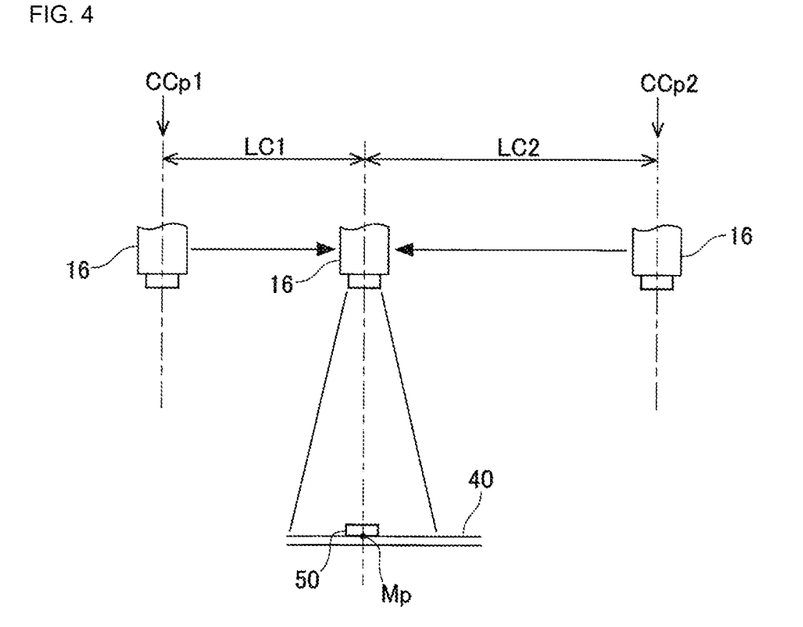
FIG. 4 illustrates operation of the component transfer device during imaging operation.

Display control section 34 displays image data from imaging from board camera 16 on display device 17. Display device 17 is, for example, an LCD monitor or touchscreen provided on the operation panel of control device 30 (refer to FIG. 4B). Display control section 34 displays image data of various types of image processing performed by image processing section 32.

Memory device 35 is configured from an optical drive device such as a hard disk device, flash memory, or the like. Memory device 35 memorizes a control program for operating component mounter 1, image data sent from component camera 15 or board camera 16 to control device 30 via a bus or communication cable, temporary data of processing by image processing section 32, and the like. Input-output interface 36 converts the data type or adjusts the signal strength between the CPU or memory device 35 and each control circuit 76 or 77.

Motor control circuit 37 is used for controlling each axis motor provided in component transfer device 13 based on control signals from mounting control section 31. By this, the position of mounting head 23 is decided in each axis direction. Also, by control of the motor of each axis, the raising and lowering position (Z-axis direction position) and rotation angle of a specified suction nozzle 24 is decided.

Imaging control circuit 38 controls imaging by component camera 15 and board camera 16 based on imaging control signals sent by imaging control section 33. Also, imaging control circuit 38 acquires image data from imaging by component camera 15 and board camera 16 and memorizes the image data on memory device 35 via input-output interface 36.

2. Configuration of Inspection Support Device 90

In the present embodiment, inspection support device 90 that supports inspection is configured including board camera 16 and imaging control section 33 on component mounter 1. Inspection support device 90 supports automatic inspection or manual visual inspection of a mounting state of inspection component 50 that is a target for inspection from among electronic components mounted by component mounter 1 on circuit board 40. Specifically, inspection support device 90 supports the above inspection by optimizing the operation order of multiple mounting operations and multiple imaging operations.

2-1. Definitions of Mounting Operation and Imaging Operation

Figure 3:
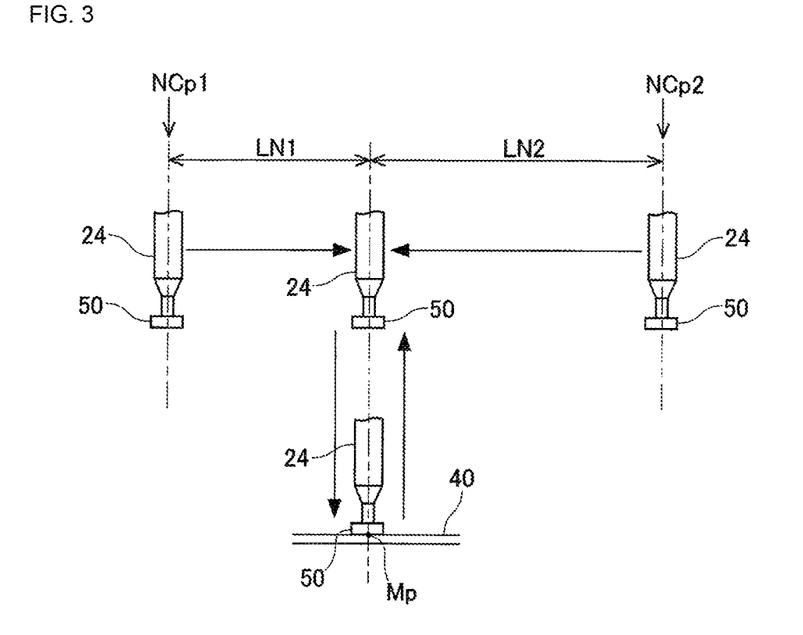
FIG. 3 illustrates operation of a component transfer device during mounting operation.

Here, "mounting operation" is defined as operation of component transfer device 13 of moving suction nozzle 24 from current position NCp to above mounting position Mp, lowering suction nozzle 24, and mounting inspection component 50 being held on suction nozzle 24 at mounting position Mp. These mounting operations are performed in order according to a control program.

Specifically, as shown in FIG. 3, when suction nozzle 24 is at first current position NCp1, mounting operation corresponds to operation of XY movement of suction nozzle 24 from first current position NCp1 to above mounting position Mp, lowering operation for mounting inspection component 50 being held by suction nozzle 24 on circuit board 40, and raising operation for returning suction nozzle 24 to its original height.

Current position NCp of suction nozzle 24 is a position that depends on the immediately previous operation of component transfer device 13, and corresponds to the position of suction nozzle 24 at the point in time when the immediately previous operation was completed. Therefore, even if mounting operation that mounts inspection component 50 is performed at specified mounting position Mp, in a case in which there was some deviation in the immediately previous operation, the current position NCp of suction nozzle 24 may differ. Also, the immediately previous operation of component transfer device 13, for example, may be changed in a case in which imaging operation is inserted directly before mounting operation.

Due to this, even for the same mounting operation, suction nozzle 24 may be positioned at different positions such as first current position NCp1 or second current position NCp2. Here, when distance LN1 from the position above mounting position Mp to first current position NCp1, and distance LN2 from above mounting position Mp to second current position NCp2 are different, the moving distance of moving body 22 during mounting operation, and the operation time (required time) for mounting operation are different.

Also, "imaging operation" is defined as operation of component transfer device 13 of moving board camera 16 from current position CCp to above mounting position Mp such that board camera 16 can image inspection component 50 mounted at mounting position Mp. Specifically, as shown in FIG. 4, in a case in which board camera 16 is at first current CCp1, imaging operation corresponds to operation of XY movement by board camera 16 from first current position CCp1 to above mounting position Mp. Note that, for imaging operation, board camera 16 does not have to be directly above mounting position Mp. That is, board camera 16, via imaging operation, moves to an area in which inspection component 50 is within the camera field of view.

Current position CCp of board camera 16 is a position that depends on the immediately previous operation of component transfer device 13, and corresponds to the position of board camera 16 at the point in time when the immediately previous operation was completed. Therefore, even if imaging operation that images inspection component 50 mounted at specified mounting position Mp, in a case in which there was some deviation in the immediately previous operation, the current position CCp of board camera 16 may differ. Also, the immediately previous operation of component transfer device 13, for example, may be changed in a case in which a different imaging operation is inserted directly before imaging operation.

Due to this, even for the same imaging mounting operation, board camera 16 may be positioned at different positions such as first current position CCp1 or second current position CCp2. Here, when distance LC1 from the position above mounting position Mp to first current position CCp1, and distance LC2 from above mounting position Mp to second current position CCp2 are different, the moving distance of moving body 22 during imaging operation, and the operation time (required time) for imaging operation are different.

2-2. Mounting Processing by Component Mounter 1

Figure 5:
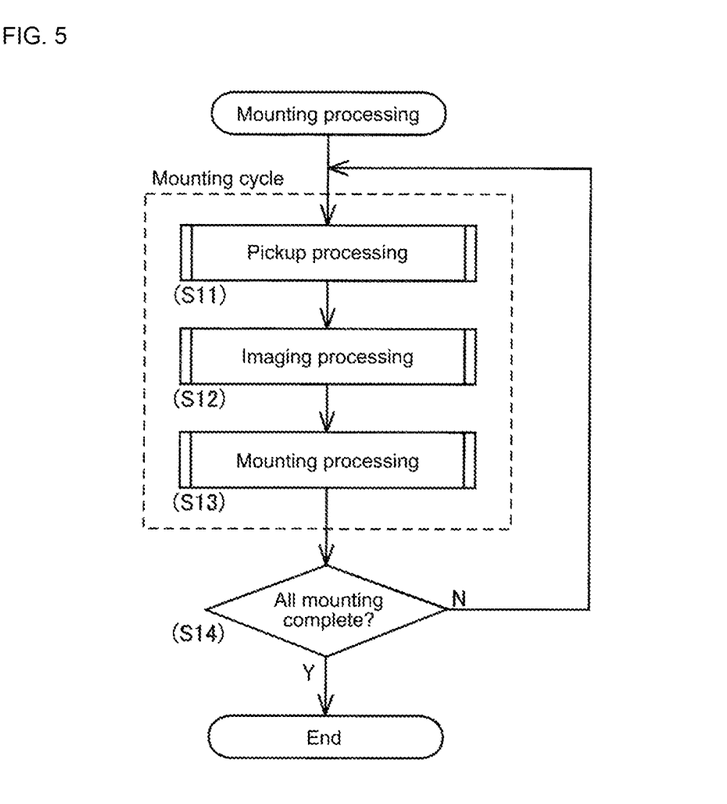
FIG. 5 is a flowchart showing mounting processing by the component mounter.

Mounting processing of electronic components by component mounter 1 will be described with reference to FIG. 5. During mounting processing, mounting control section 31 first picks up electronic components sequentially using multiple suction nozzles 24 to perform pickup processing (step 11 [hereinafter "step" is abbreviated to "S"]) of holding an electronic component. Next, imaging control section 33 moves mounting head 23 above component camera 15 by operation of component transfer device 13 and performs imaging processing of imaging multiple electronic components that have been picked up (S12).

Then, mounting control section 31 performs mounting processing of sequentially mounting the electronic components on circuit board 40 (S13). Next, mounting control section 31, based on a control program, determines whether mounting processing has been completed for all electronic components (S14). Control device 30 repeats the above processing (S11 to S13) until mounting processing is complete.

Further, with mounting processing by component mounter 1, to improve mounting accuracy, mounting control section 31 controls movement of suction nozzle 24 in accordance with the pickup condition of the electronic component held by the suction nozzle 24. Therefore, mounting control section 31 performs image processing in image processing section 32 on image data acquired during imaging processing (S12) so as to recognize the pickup condition of the electronic component held by the suction nozzle 24.

Here, a "mounting cycle" is defined as operation from the multiple pickup of electronic components supplied by component transfer device 13 until repeated mounting operation has been performed a quantity of times equal to the quantity of held electronic components, that is, operation of component transfer device 13 for performing the above processing (S11 to S13). In a case in which mounting head 23 supports twelve suction nozzles 24, operation from picking up a maximum of twelve electronic components until all the electronic components have been mounted is taken as one mounting cycle.

2-3. Optimization Processing by Inspection Support Device 90

Figure 6:
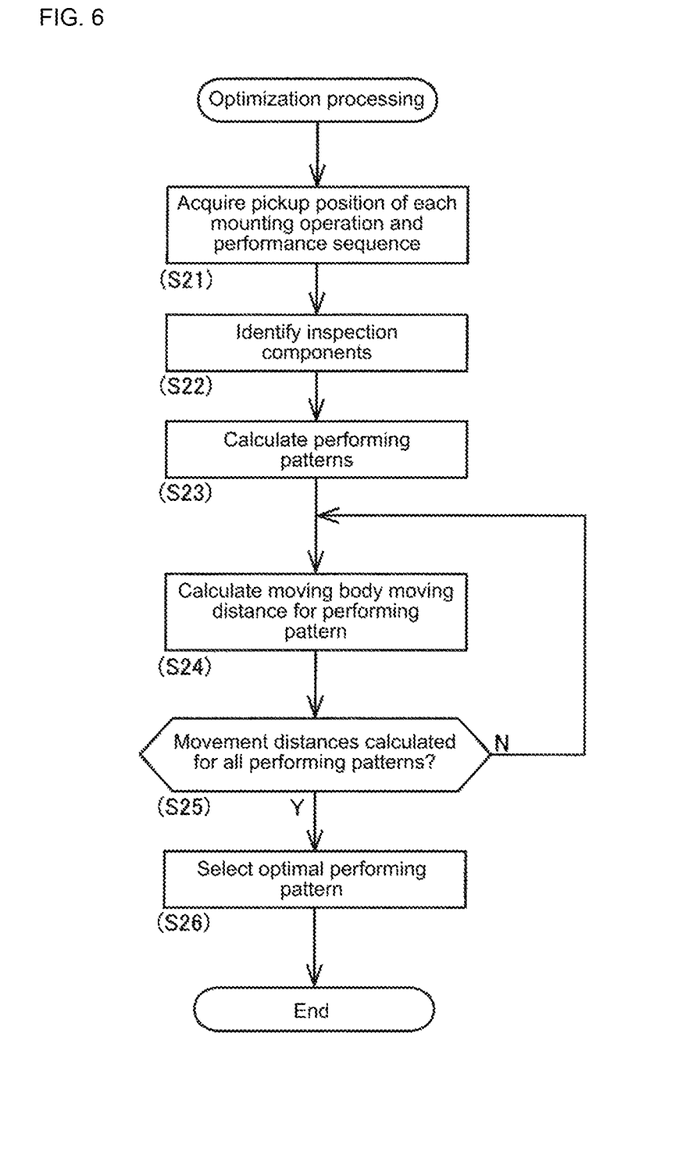
FIG. 6 is a flowchart show optimization processing of the performance sequence of mounting operation and imaging operation.

Optimization processing of the performance sequence of mounting operation and imaging operation by imaging control section 33 that configures inspection support device 90 will be described with reference to FIGS. 6 and 7. In the present embodiment, imaging control section 33 optimizes the performance sequence of mounting operation and imaging operation that corresponds to the mounting operation included in one mounting cycle. Also, in a mounting cycle, all twelve suction nozzles 24 held on mounting head 23 pick up and hold an electronic component, and each electronic component is to be mounted at a different mounting position Mp.

Imaging control section 33, first, based on a control program, acquires mounting positions Mp that correspond to the twelve mounting operations and a performance sequence of mounting operations (S21). First mounting operation MV1 to twelfth mounting operation MV12 of the mounting cycle are performed consecutively and sequentially as shown by the upper level in FIG. 7 in a case in which not considering imaging operation for acquiring image data used in inspection.

Figure 7:
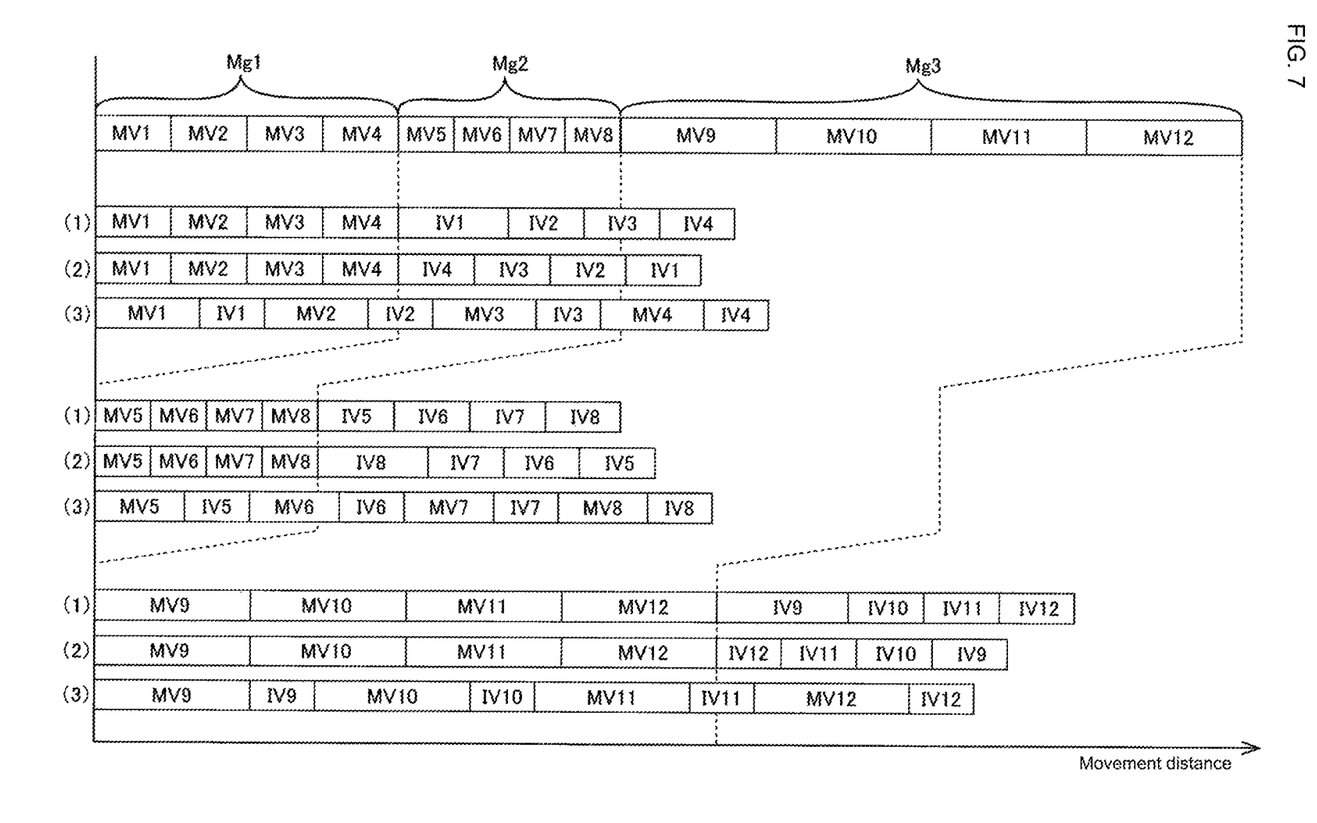
FIG. 7 shows the relationship between the performance sequence of mounting operation and imaging operation and the movement distance of the moving device.

Here, the sideways width of each mounting operation MV1 to MV12 in FIG. 7 represents the moving distance of moving body 22 during each mounting operation in a case in which mounting processing is performed consecutively in the performance sequence. That is, fifth mounting operation MV5 to eighth mounting operation MV8 for which the sideways width is relatively small each have a corresponding mounting position Mp that is a close distance to the other mounting positions Mp. On the other hand, ninth mounting operation MV9 to twelfth mounting operation MV12 for which the sideways width is relatively large each have a corresponding mounting position Mp that is a long distance to the other mounting positions Mp.

Next, inspection support device 90, based on inspection information memorized in memory device 35 of control device 30, specifies inspection components as targets for inspection form among the electronic components held by the suction nozzles 24 (S22). Here, all twelve electronic components are targets for inspection. Thus, imaging control section 33 uses the following processing to decide in which order to perform first imaging operation IV1 to twelfth imaging operation IV12 that correspond to first mounting operation MV1 to twelfth mounting operation MV12 in the mounting cycle.

Imaging control section 33 calculates a performance sequence pattern (hereinafter "performing pattern") of the twelve mounting operations MV1 to MV12 and the twelve imaging operations IV1 to IV12 (S23). Here, to establish the above performing pattern, imaging operation IVn that corresponds to mounting operation MVn performed in the nth order, must be performed after the corresponding mounting operation MVn. Performing mounting operations in the order according to the mounting program or consecutively performing imaging operations while satisfying the above condition are allowed.

Imaging control section 33, for performing patterns calculated as candidates for the optimal performance sequence, calculates the moving distance of moving body 22 during the performance sequence (that includes mounting operations and imaging operations), or the operation time required for mounting operations MV1 to MV12 and imaging operations IV1 to IV12 during the performance sequence. In the present embodiment, imaging control section 33 calculates the moving distance of moving body 22 for each performing pattern (S24).

Specifically, assuming that mounting operation MV1 to MV12 and imaging operation IV1 to IV12 are performed in a specified order, the moving distance during the performing pattern is calculated by adding together the distances between mounting position Mp and the current position CCp of board camera 16 and the current position NCp of suction nozzle 24 for each operation. Imaging control section 33 determines whether the moving distance of moving body 22 has been calculated for all the performing patterns (S25), and repeats the above processing (S24) until calculating the moving distance of moving body 22 is complete.

Continuing, imaging control section 33, based on the moving distance of moving body 22 calculated for each performing pattern, selects the most efficient performing pattern from the multiple performing patterns (S26). By this, the performance sequence of the twelve mounting operations MV1 to MV12 and the twelve imaging operations IV1 to IV12 are optimized.

The performing pattern of the performance sequence optimized by the above processing is described below. Here, a "mounting group" is defined as a portion of the mounting operations performed consecutively among the multiple mounting operations included in a mounting cycle. Also, in a case in which the mounting operation to be performed in an order based on a control program has already been optimized, there are three general patterns of performance sequence for imaging operation within a mounting group: (1) performing imaging operation after performing mounting operation and in the same order, (2) performing imaging operation after performing mounting operation in a reverse order, and (3) performing mounting operation and imaging operation alternately.

"Same order" in the above pattern (1) means in the same order as the performance sequence as the multiple mounting operations, and "reverse order" in the above pattern (2) means in the reverse order to the performance sequence of the multiple mounting operations. In FIG. 7 the above patterns (1) to (3) are shown for each mounting group.

For first mounting group Mg1 that includes from first mounting operation MV1 to fourth mounting operation MV4, as shown in the upper level in FIG. 7, pattern (2), that is, after performing the first mounting operation MV1 to fourth mounting operation MV4, performing the corresponding first imaging operation IV1 to fourth imaging operation IV4 consecutively and in the reverse order to the mounting operations, results in the shortest moving distance of moving body 22.

For second mounting group Mg2 that includes from fifth mounting operation MV5 to eighth mounting operation MV8, as shown in the middle level in FIG. 7, pattern (1), that is, after performing fifth mounting operation MV4 to eighth mounting operation MV8, performing the corresponding fifth imaging operation IV4 to eighth imaging operation IV8 consecutively and in the same order as the mounting operations, results in the shortest moving distance of moving body 22.

And, for third mounting group Mg3 that includes from ninth mounting operation MV9 to twelfth mounting operation MV12, as shown in the lower level in FIG. 7, pattern (3), that is alternately performing mounting operation and imaging operation, results in the shortest moving distance of moving body 22. Therefore, the performance sequence optimized by the above processing corresponds to a linked performance sequence of "pattern (2) of first mounting group Mg1", "pattern (1) of second mounting group Mg2", and "pattern (3) of third mounting Mg3".

In this manner, the moving distance of moving body 22 is changed by appropriately changing the performance sequence of mounting operation and imaging operation for each mounting group. This is due to the relationship between each mounting position Mp and the light axis of board camera 16 from suction nozzle 24. Therefore, imaging control section 33 may perform calculation of the performing pattern (S23) after setting multiple mounting groups based on the performance sequence of mounting operations and mounting positions Mp corresponding to each mounting operation MV1 to MV12 acquired in S21. By this, it is possible to calculate the moving distance (S24) more efficiently than by calculating all performing patterns.

2-4. Insertion of Imaging Processing for Inspection During Mounting Processing

Inspection support device 90, with performance of mounting processing by mounting control section 31, performs processing to optimize the performance sequence of multiple mounting operations and multiple imaging operations based on predetermined conditions. With respect to this, the above predetermined conditions are, in the present embodiment, the planned component type to be mounted, the current time, the quantity of mounting operations to perform, and the time from the last inspection to the current time.

That is, if at least one of these conditions is satisfied, imaging control section 33 of inspection support device 90 performs optimization processing. Note that, "planned component type to be mounted" means that for a specified component type that is an inspection target, the electronic component of that component type must be planned to be mounted within the period from the current time to a stipulated time. Also, when mounting processing by component mounter 1 arrives at performing of a mounting cycle including mounting of an inspection component, imaging control section 33 inserts imaging processing by board camera 16 into mounting processing in accordance with the performance sequence of the optimized imaging operation.

Here, for automatic inspection or manual visual inspection at component mounter 1, in a case in which a mounting state is determined to be bad, there are cases in which subsequent mounting operations are canceled to avoid wasting electronic components. That is, after image data of inspection component 50 has been acquired by imaging control section 33, mounting operation is stopped temporarily for the period until the inspection result indicating good or bad is entered. Inspection support device 90 uses this period to perform preparation operation for the next mounting operation.

More specifically, in a case in which manual visual inspection at component mounter 1 is performed by an operator, first, display control section 34 of control device 30 displays image data acquired by control of imaging processing by imaging control section 33 on display device 17. The operator refers to the displayed image data, determines whether the mounting state of inspection component 50 is good or bad, and enters the determination result. At this time, imaging control section 33 moves suction nozzle 24 from current position NCp to above mounting position Mp for the next mounting operation within the period from acquiring the above image data to when the inspection result is input.

By performing preparation operation for the next mounting operation during inspection in this manner, for example, in a case in which a result that the mounting state is good is entered, it is possible to lower the suction nozzle and quickly perform mounting operation for the next component. On the other hand, in a case in which a result that the mounting state is bad is entered, wasting components can be prevented by canceling subsequent mounting operations.

3. Effects Due to the Configuration of Embodiments

In the present embodiment, inspection support device 90 is applied to component mounter 1 provided with a transfer device (component transfer device 13) that picks up an electronic component supplied to supply position S and transfers the electronic component to mounting position Mp on circuit board 40. Inspection support device 90 supports inspection of a mounting state that is performed on target electronic components mounted on circuit board 40. The transfer device includes moving body 22 supported to be relatively movable with respect to base 2, and mounting head 23 provided on the moving body, mounting head 23 supporting multiple suction nozzles 24 that hold the electronic component. Inspection support device 90 is provided with a camera (camera 16) capable of imaging circuit board 40, camera 16 being provided on moving body 22, and imaging control section 33 configured to control imaging processing of the camera and acquire image data of inspection component 50, which is a component that is a target for inspection among the electronic components mounted by component mounter 1, when the inspection component 50 is mounted on the circuit board 40. Mounting operation is defined as the operation performed in order based on a control program, which is an operation of the transfer device to mount inspection component 50 held by suction nozzle 24 at mounting position Mp by moving suction nozzle 24 from current position NCp to a position above mounting position Mp and lowering suction nozzle 24. Imaging operation is defined as operation of the transfer device of moving the camera from current position CCp to above mounting position Mp such that the camera can image inspection component 50 mounted at mounting position Mp. Imaging control section 33 optimizes the performance sequence of multiple of the mounting operations and multiple of the imaging operations based on a moving distance of moving body 22 during the performance sequence or based on a time required for the mounting operation and the imaging operation during the performance sequence.

Also, the inspection support method of the present embodiment optimizes the performance sequence of multiple of the mounting operations and multiple of the imaging operations based on a moving distance of moving body 22 during the performance sequence or based on a time required for the mounting operation and the imaging operation during the performance sequence, and controls imaging processing of the camera (board camera 16) to acquire image data of inspection component 50, which is a component that is a target for inspection among the electronic components mounted by component mounter 1, when the inspection component 50 is mounted on circuit board 40.

According to such a configuration, inspection support device 90 and the inspection support method (S21 to S26) enable inspection of a mounting state based on image data acquired by imaging of camera 16 provided in component mounter 1. Here, to acquire image data that includes inspection component 50, imaging processing of board camera 16 is performed after inspection component 50 has been mounted on circuit board 40. With this imaging processing, it is necessary to move moving body 22 such that the inspection component 50 fits in the field of view of board camera 16.

However, by performing each of the mounting operations and imaging operations in a series, or by performing mounting operations and imaging operations alternately, based on the relationship between mounting position Mp of the corresponding multiple mounting operations and the distance between the suction nozzle 24 and the light axis of board camera 16, the moving distance of moving body 22 may become longer, such that the efficiency of imaging processing is worsened.

Therefore, inspection support device 90 and the inspection support method, as indicated in the embodiment, optimize the timing of performing imaging operations leased on the moving distance of moving body 22 during the performing pattern with respect to mounting operations performed in a predetermined order based on a control program. By this, because the required image data is acquired efficiently, the efficiency of inspection of the mounting condition is improved.

Also, a mounting cycle is defined as operation from the multiple pickup of electronic components supplied by the transfer device (component transfer device 13) until repeated mounting operation has been performed a quantity of times equal to the quantity of held electronic components. Imaging control section 33 optimizes the performance sequence of mounting operation and imaging operation that corresponds to the mounting operation included in the mounting cycle. According to such a configuration, the performance sequence of multiple mounting operations and multiple imaging operations are optimized by individual mounting cycles. Therefore, in a case in which multiple inspection components 50 are included in the electronic components mounted in one mounting cycle, required imaging processing can be performed without influencing other mounting cycles and while curtailing influence on mounting processing of the mounting cycle.

Also, the multiple imaging operations that correspond to each of the multiple mounting operations performed continuously among the mounting cycle (first mounting group Mg1 and second mounting group Mg2) are performed in a series after the multiple mounting operations are complete. According to such a configuration, for example, in a case in which the mounting positions Mp of respective multiple inspection components 50 to be mounted in second mounting group Mg2 are relatively close together, the mounting operations corresponding to those inspection components 50 are performed in a series, and the multiple imaging operations are also performed in a series all together after that. Therefore, the moving distance of moving body 22 is shortened when performing imaging processing.

Further, the multiple imaging operations corresponding to each of the multiple mounting operations are performed in the opposite order to the performance sequence of the multiple mounting operations. According to such a configuration, for example, for a state in which suction nozzle 24 is positioned above mounting position Mp corresponding to the last mounting operation in first mounting group Mg1, when the position of board camera 16 is closer to the mounting position Mp corresponding to the last mounting operation than to the mounting position Mp corresponding to the first mounting operation, mounting operation corresponding to these inspection components 50 is performed in opposite order to the mounting operations. Therefore, the moving distance of moving body 22 is shortened when performing imaging processing.

Also, the multiple imaging operations corresponding to each of the multiple mounting operations performed consecutively among the mounting cycle (third mounting group Mg3) are performed after performing the corresponding mounting operations. According to such a configuration, in a case in which the mounting positions Mp of respective multiple inspection components 50 to be mounted in third mounting group Mg3 are relatively far apart, the mounting operations and imaging operations corresponding to those inspection components 50 are performed alternately. By this, extending of the moving distance of moving body 22 is curtailed when performing imaging processing.

Also, imaging control section 33, while component mounter 1 is performing mounting processing, performs processing for optimizing the performance sequence of multiple mounting operations and multiple imaging operations based on predetermined conditions, and inserts imaging processing of the camera (board camera 16) into mounting processing. According to such a configuration, it is possible to make electronic components of a type that especially requires mounting accuracy an inspection target, and to perform periodical inspection. This improves the product quality of circuit board 40.

Also, the above predetermined conditions are: the planned component type to be mounted, the current time, the quantity of mounting operations to perform, and the time from the last inspection to the current time. According to such a configuration, inspection can be performed by an operator at any timing. By this, favorable product quality of circuit board 40 is maintained.

Further, imaging control section 33 performs preparation operation of moving suction nozzle 24 from current position NCp to above mounting position Mp for the next mounting operation within the period from acquiring the above image data to when the inspection result is input. By this, in a case in which a result that the mounting state is good is entered, it is possible to lower suction nozzle 24 and quickly perform mounting operation for the next component. This curtails lowering of throughput caused by performing imaging processing. Further, in a case in which a result that the mounting state is bad is entered, wasting components can be prevented by canceling subsequent mounting operations.

ALTERNATE EMBODIMENTS

In the above embodiment, imaging control section 33 of inspection support device 90 calculates (S24) the moving distance of moving body 22 for the performance sequence of mounting operations and imaging operations for the multiple performing patterns calculated in S23. With respect to this, imaging control section 33 may calculate operation time (required time) required for mounting operations MV1 to MV12 and imaging operations Ni to IV12 for the performance sequence.

That is, imaging control section 33, in S26, may select the optimal performance sequence based on the required time when performing each of the performance sequences. Here, the moving distance of moving body 22 and the required time are correlated, but the relationship is not necessarily proportional. This is because of the fact that required time includes time for accelerating and decelerating during operation of component transfer device 13, and that moving operation of moving body 22 and operation of mounting head 23 (for example, movement of suction nozzle 24) may be performed in parallel.

Therefore, imaging control section 33 may be configured to optimize the performance sequence based on required time. By this, compared to optimizing based on the moving distance of moving body 22, optimization of the performance sequence of mounting operations and imaging operations can be performed more accurately. However, from the viewpoint of decreasing the processing load during optimization, the first embodiment is better.

Further, in the first embodiment, inspection support device 90 optimizes one mounting cycle. However, inspection support device 90 may optimize multiple mounting cycles all at once, or may optimize only a portion of a mounting cycle. Such a configuration achieves the same effects as the first embodiment.

REFERENCE SIGNS LIST

1: component mounter; 2: base; 13: component transfer device (transfer device); 22: moving body; 23: mounting head; 24: suction nozzle; 16: board camera (camera); 30: control device; 33: imaging control section; 40: circuit board; 50: inspection component (electronic component); 90: inspection support device; Sp: supply position; Mp: mounting position; NCp: current position; NCp1: first current position; NCp2: second current position; CCp: current position; CCp1: first current position; CCp2: second current position; Mg1: first mounting group; Mg2: second mounting group; Mg3: third mounting group

The invention claimed is:

1. An inspection support device for supporting inspection of a mounting state performed on an electronic component mounted on a circuit board as the target, the inspection support device being applied to a component mounter provided with a transfer device that picks up an electronic component supplied to a supply position and transfers the electronic component to a mounting position on a circuit board, the transfer device including a moving body supported to be relatively movable with respect to a base, and a mounting head provided on the moving body, the mounting head supporting multiple suction nozzles that hold the electronic component, the inspection support device comprising:

a camera configured to image the circuit board, the camera being provided on the moving body, and imaging control circuitry configured to control imaging processing of the camera and to acquire image data of an inspection component, which is a component that is a target for inspection among the electronic components mounted by the component mounter, when the inspection component is mounted on the circuit board, wherein a mounting operation is performed in order based on a control program, and defined as an operation of the transfer device to mount the inspection component held by the suction nozzle at the mounting position by moving the suction nozzle from its current position to a position above the mounting position and lowering the suction nozzle, an imaging operation is defined as an operation of the transfer device to move the camera from its current position to a position above the mounting position such that the camera images the inspection component mounted at the mounting position, and the imaging control circuitry optimizes a performance sequence of multiple of the mounting operations and multiple of the imaging operations based on a moving distance of the moving body during the performance sequence or based on a time required for the mounting operation and the imaging operation during the performance sequence.

2. The inspection support device according to claim 1, wherein a mounting cycle is defined as an operation from the multiple pickup of the electronic components supplied by the transfer device until repeated performance of the mounting operation has been performed a quantity of times equal to the quantity of the held electronic components, and the imaging control circuitry optimizes the performance sequence of the mounting operation and the imaging operation that corresponds to the mounting operation included in the mounting cycle.

3. The inspection support device according to claim 2, wherein the multiple imaging operations corresponding to each of the multiple mounting operations performed continuously among the mounting cycle are performed in a series after the multiple mounting operations are complete.

4. The inspection support device according to claim 3, wherein the multiple imaging operations corresponding to each of the multiple mounting operations are performed in the opposite order to the performance sequence of the multiple mounting operations.

5. The inspection support device according to claim 2, wherein the multiple imaging operations corresponding to each of the multiple mounting operations performed continuously among the mounting cycle are performed after the corresponding mounting operation.

6. The inspection support device according to claim 1, wherein the imaging control circuitry, while the component mounter is performing mounting processing, performs processing for optimizing the performance sequence of the multiple mounting operations and the multiple imaging operations based on predetermined conditions, and inserts imaging processing of the camera into the mounting processing.

7. The inspection support device according to claim 6, wherein the predetermined conditions are planned component type to be mounted, current time, quantity of mounting operations to perform, and time from last inspection to the current time.

8. The inspection support device according to claim 1, wherein the imaging control circuitry performs a preparation operation of moving the suction nozzle from the current position to above the mounting position for the next mounting operation within the period from acquiring the image data to when the inspection result is input.

9. An inspection support method for supporting inspection of a mounting state performed on an electronic component mounted on a circuit board as the target, the inspection support device being applied to a component mounter provided with a transfer device that picks up an electronic component supplied to a supply position and transfers the electronic component to a mounting position on a circuit board, the transfer device including a transfer body supported to be relatively movable with respect to a base, and a mounting head provided on a moving body, the mounting head supporting multiple suction nozzles that hold the electronic component, inspection support method comprising:

defined defining a mounting operation as an operation performed in order based on a control program, the operation being of the transfer device to mount the inspection component held by the suction nozzle at the mounting position by moving the suction nozzle from its current position to a position above the mounting position and lowering the suction nozzle, and an imaging operation is defined as operation of the transfer device to move a camera, which is provided on the moving body and configured to image the circuit board, from its current position to a position above the mounting position such that the camera images the inspection component mounted at the mounting position, optimizing a performance sequence of multiple of the mounting operations and multiple of the imaging operations based on a moving distance of the moving body during the performance sequence or based on a time required for the mounting operation and the imaging operation during the performance sequence, and controlling imaging processing of the camera to acquire image data of the inspection component, which is a component that is a target for inspection among the electronic components mounted by the component mounter, when the inspection component is mounted on the circuit board.

* * * * *